United States Patent
Kimura et al.

(10) Patent No.: US 9,972,667 B2
(45) Date of Patent: May 15, 2018

(54) DISPLAY DEVICE

(71) Applicant: Japan Display Inc., Tokyo (JP)

(72) Inventors: Yasukazu Kimura, Tokyo (JP); Takuma Nishinohara, Tokyo (JP); Toshihiko Itoga, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days. days.

(21) Appl. No.: 15/701,751

(22) Filed: Sep. 12, 2017

(65) Prior Publication Data
US 2018/0097048 A1    Apr. 5, 2018

(30) Foreign Application Priority Data

Oct. 5, 2016  (JP) .................. 2016-197139

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0011* (2013.01); *H01L 51/56* (2013.01); *H01L 2227/323* (2013.01)

(58) Field of Classification Search
CPC . H01L 27/3246; H01L 51/56; H01L 51/0011; H01L 2227/323; H01L 51/102–51/105; H01L 51/5203–51/5234; H01L 27/1463; H01L 27/3258; H01L 27/3283; H01L 27/1248; H01L 27/3295; H01L 2227/32
See application file for complete search history.

(56) References Cited

U.S. PATENT DOCUMENTS

| | | | |
|---|---|---|---|
| 9,660,010 B2* | 5/2017 | Park | H01L 27/3265 |
| 9,853,094 B2* | 12/2017 | Kajiyama | H01L 27/3248 |
| 2016/0233251 A1* | 8/2016 | Sasaki | H01L 27/1225 |
| 2017/0141172 A1* | 5/2017 | Cho | H01L 51/56 |

FOREIGN PATENT DOCUMENTS

JP    2002-231449 A    8/2002

* cited by examiner

*Primary Examiner* — Selim Ahmed
(74) *Attorney, Agent, or Firm* — Typha IP LLC

(57) ABSTRACT

A display device includes a substrate having an insulating surface; a plurality of pixel electrodes on the insulating surface, the plurality of pixel electrodes located away from each other; a first insulating layer covering an end of each of the pixel electrodes and exposing a part of a top surface of each of the pixel electrodes; and an organic layer provided on each of the pixel electrodes, the organic layer including a light emitting layer. As seen in a plan view, the first insulating layer includes a plurality of first regions, each of the plurality of first regions being around the exposed part of the top surface of the pixel electrodes, and a second region located between two adjacent first regions, the second region including a recessed portion.

9 Claims, 18 Drawing Sheets

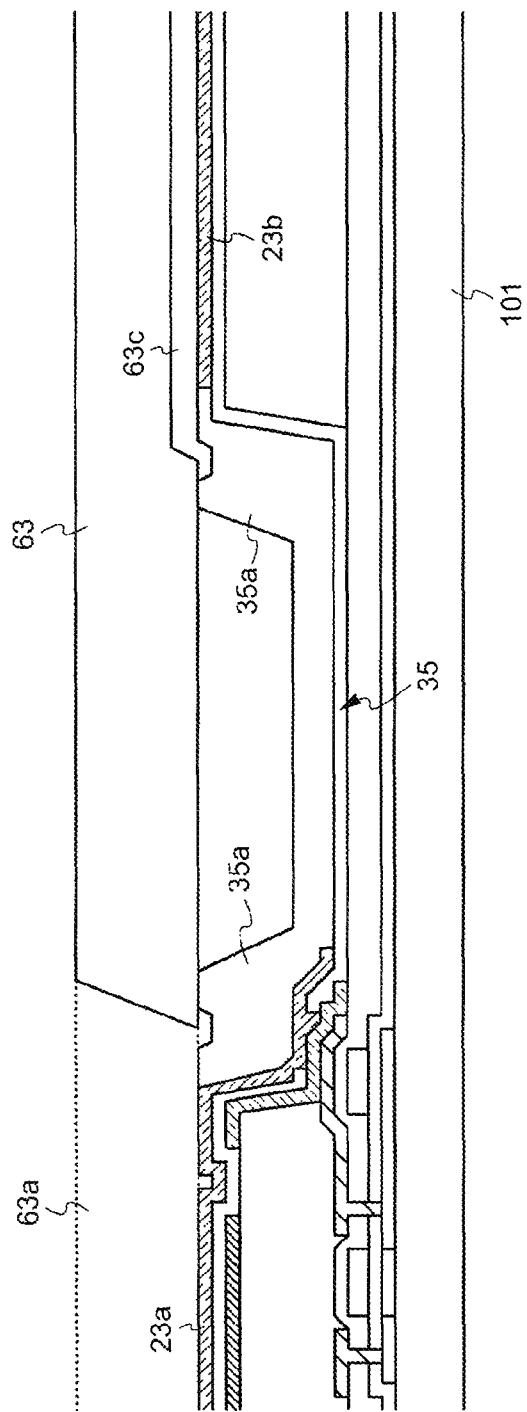

DISPLAY DEVICE

CROSS REFERENCE TO RELATED APPLICATIONS

This application is based upon and claims the benefit of priority from the prior Japanese Patent Application No. 2016-197139, filed on 5 Oct. 2016, the entire contents of which are incorporated herein by reference.

FIELD

The present invention relates to a display device including a plurality of pixels, and specifically, to a display device including a light emitting element in each of the pixels.

BACKGROUND

Conventionally, as a display device usable for a display of a mobile terminal, a TV or the like, an organic EL (electroluminescence) display device including an organic EL element is known. An organic EL display device has advantages of emitting bright light, having superb viewing angle characteristics, and the like, and thus rapid development thereof is desired to provide a display device replacing a liquid crystal display device.

Organic EL materials usable for the light emitting element include a low molecular weight-type organic EL material and a high molecular weight-type organic EL material. In the case where a low molecular weight-type organic EL material is used, a film is usually formed by vapor deposition by use of a blocking mask. In this case, a blocking mask is located between a substrate including pixel electrodes and a vapor source, and vapor deposition is performed in the state where a plurality of openings provided in the blocking mask are positionally matched to the pixel electrodes. As a result, a thin film of an organic EL material is formed selectively on desired pixel electrodes (Japanese Laid-Open Patent Publication No. 2002-231449).

SUMMARY

A display device in an embodiment according to the present invention includes a substrate having an insulating surface; a plurality of pixel electrodes on the insulating surface, the plurality of pixel electrodes located away from each other; a first insulating layer covering an end of each of the pixel electrodes and exposing a part of a top surface of each of the pixel electrodes; and an organic layer provided on each of the pixel electrodes, the organic layer including a light emitting layer. As seen in a plan view, the first insulating layer includes a plurality of first regions, each of the plurality of first regions being around the exposed part of the top surface of the pixel electrodes, and a second region located between two adjacent first regions, the second region including a recessed portion.

BRIEF EXPLANATION OF DRAWINGS

FIG. 11A is a cross-sectional view showing an example of a step of a method for producing the organic EL display device in embodiment 1;

DESCRIPTION OF EMBODIMENTS

In the case where the above-described blocking mask is used, if the distance between the pixel electrodes and the openings in the blocking mask is too long, the shape of the openings in the blocking mask and regions in which the organic EL material is actually formed into the films may be different from each other. By contrast, if the distance between the pixel electrodes and the openings in the blocking mask is too short, foreign objects may be held between the pixel electrodes and the blocking mask, or between the blocking mask and a partitioning wall provided between the pixel electrodes. In this case, the pixel electrodes or other components may be damaged, or the parallelism between the pixel electrodes and the blocking mask is decreased. As a result of the latter, the positions at which the films of the organic EL material are formed may be shifted from the positions of the pixel electrodes.

An object of the present invention is to provide a display device including a structure locating the pixel electrodes and the openings in the blocking mask close to each other.

Another object of the present invention is to provide a display device including a structure decreasing the influence of the foreign objects during the vapor deposition performed by use of the blocking mask.

(Process to Achieve the Present Invention)

Figure 17:
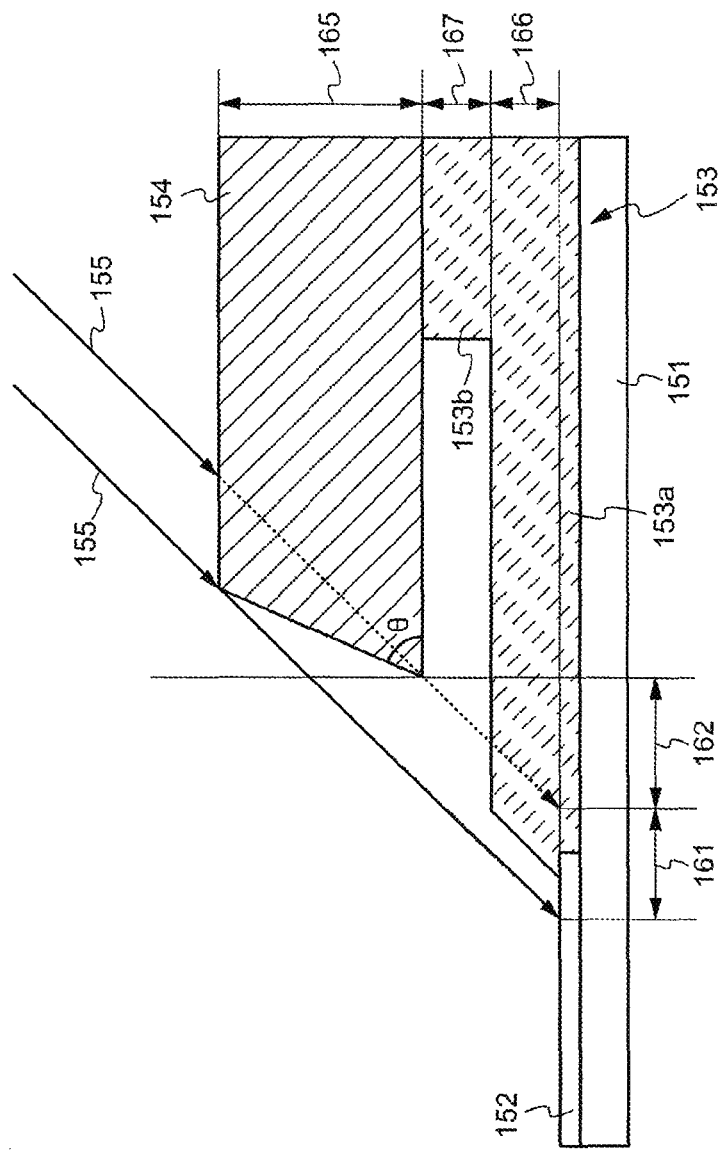
FIG. 17 shows a comparative example in which a thin film of an organic EL material is formed by vapor deposition.

During the process of development of the organic EL display device, the present inventors used a method shown in FIG. 17 for performing vapor deposition by use of a blocking mask. FIG. 17 shows a comparative example in which a thin film of an organic EL material is formed by vapor deposition.

As shown in FIG. 17, a pixel electrode 152 and an insulating film 153 are provided on a substrate 151. The insulating film 153 is provided to cover an end of the pixel electrode 152. Therefore, a part of a top surface of the pixel electrode 152 is exposed. The insulating film 153 plays a role of defining a light emitting region of an organic EL element, and is generally called a "bank" or a "rib". In FIG. 17, the insulating film 153 includes a first region 153a acting as a bank and a second region 153b acting as a mask bearing member that supports a blocking mask 154.

A vapor source (not shown) is usually a linear vapor source. Such a linear vapor source is scanned in one direction (direction perpendicular to a longitudinal direction thereof), namely, the vapor source moves above the substrate 151 in such a one direction, and vapor deposition is performed while the vapor source is moving in this manner. In FIG. 17, arrow 155 represents an advancing direction of a vapor deposition material vaporized from the vapor source. As shown in FIG. 17, the vapor deposition material is blocked by the blocking mask 154 to partially reach the pixel electrode 152 or the first region 153a. As a result, a region is generated which is in the shadow of the blocking mask 154 and where the vapor deposition material is not sufficiently deposited. Herein, such a region will be referred to as a "shadow region".

A first shadow region 161 shown in FIG. 17 is a region that the vapor deposition material does not reach in a sufficient amount depending on the thickness and the tapering angle θ of the blocking mask 154. A second shadow region 162 shown in FIG. 17 is a region that vapor deposition material does not reach in a sufficient amount due to a height 166 of the first region 153a and a height 167 of the second region 153b from a surface of the pixel electrode 152. Namely, with the vapor deposition method shown in FIG. 17, there occurs the first region 161 and the second region 162a, where the vapor deposition material is not sufficiently deposited.

In such a situation, the present inventors investigated decreasing the height of the insulating film 153 in consideration of the influence of the foreign object in order to decrease the size of the above-described shadow regions. The present invention is based on the knowledge obtained as a result of the investigation.

EMBODIMENTS

Hereinafter, embodiments of the present invention will be described with reference to the drawings and the like. The present invention may be carried out in various forms without departing from the gist thereof, and is not to be construed as being limited to any of the following embodiments.

In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

In the specification and the claims, an expression that a component is "on" another component encompasses a case where such a component is in contact with the another component and also a case where such a component is above or below the another component, namely, a case where still another component is provided between such a component and the another component, unless otherwise specified.

In this specification and the claims, the terms "up", "down", "above", "below" and the like represent a positional relationship with respect to a face of a substrate on which light emitting elements are provided (hereinafter, this face will be referred to simply as a "surface"). For example, in this specification, a direction away from the surface of the substrate is defined as "upward", and a direction toward the surface of the substrate is defined as "downward".

Embodiment 1

<Structure of the Organic EL Display Device>

Figure 1:
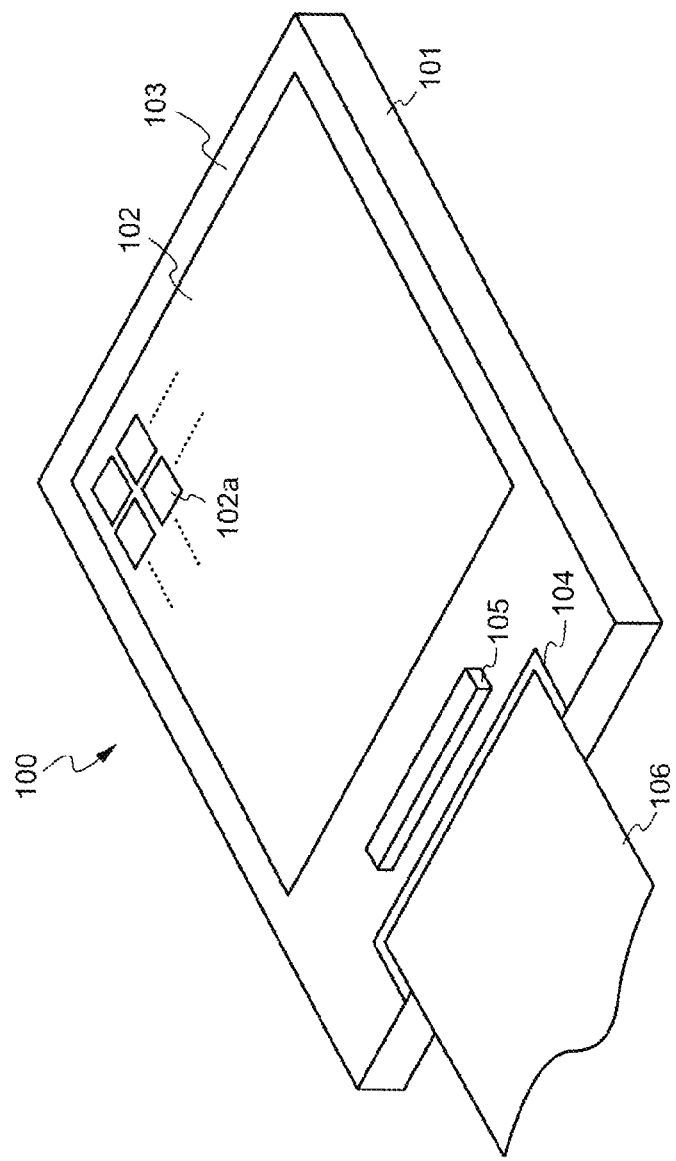
FIG. 1 is a perspective view showing an example of structure of an organic EL display device in embodiment 1.

FIG. 1 is a perspective view schematically showing a structure of an organic EL display device 100 in embodiment 1. The organic EL (electroluminescence) display device 100 in this embodiment includes a substrate 101, and also includes a display portion 102 including a plurality of pixels 102a, a peripheral portion 103 surrounding the display portion 102, a terminal portion 104 supplying an external signal to the display portion 102, a driving circuit 105 located between the display portion 102 and the terminal portion 104, and a flexible printed circuit 106 transmitting an external signal to the terminal portion 104. The display portion 102, the peripheral portion 103, the terminal portion 104, the driving circuit 105 and the flexible printed circuit 106 are provided on the substrate 101.

The display portion 102 is a portion that displays an image. The pixels 102a located in the display portion 102 each include a light emitting portion. Namely, the assembly of the plurality of pixels 102a acts as the display portion 102. The pixels 102a each include a circuit including a thin film transistor 70 described below as a driving element. In this embodiment, the thin film transistor 70 included in each pixel 102a is controlled to control light emission of a light emitting element 90 included in each pixel 102a.

The terminal portion 104 includes a line group including lines connected to the display portion 102 or the driving circuit 105, and acts as a terminal supplying an external signal. The external signal is transmitted from the flexible printed circuit 106 connected with the terminal portion 104. The terminal portion 104 and the flexible printed circuit 106 may be connected with each other by a method using a known anisotropic conductive film.

The driving circuit 105 is a circuit that outputs a control signal and a data signal to be supplied to each pixel 102a. Specifically, the driving circuit 105 may be formed of an integrated circuit such as an ASIC (Application Specific Integrated Circuit) or the like. In this embodiment, the driving circuit 105 is used to control each pixel 102a. Alternatively, a scanning line driver or a data signal driver may be provided by use of a thin film transistor in the peripheral portion 103, and a control signal or a data signal may be supplied to such a driver.

The flexible printed circuit 106 is a circuit board usable to transmit and receive a signal between the driving circuit 105 and an external circuit (not shown). The flexible printed circuit 106 includes a flexible resin substrate and a plurality of lines provided thereon, and is bonded to the terminal portion 104 and thus is electrically connected with the driving circuit 105. In FIG. 1, the driving circuit 105 is mounted on the substrate 101. Alternatively, the driving circuit 105 may be located on the flexible printed circuit 106.

Figure 2:
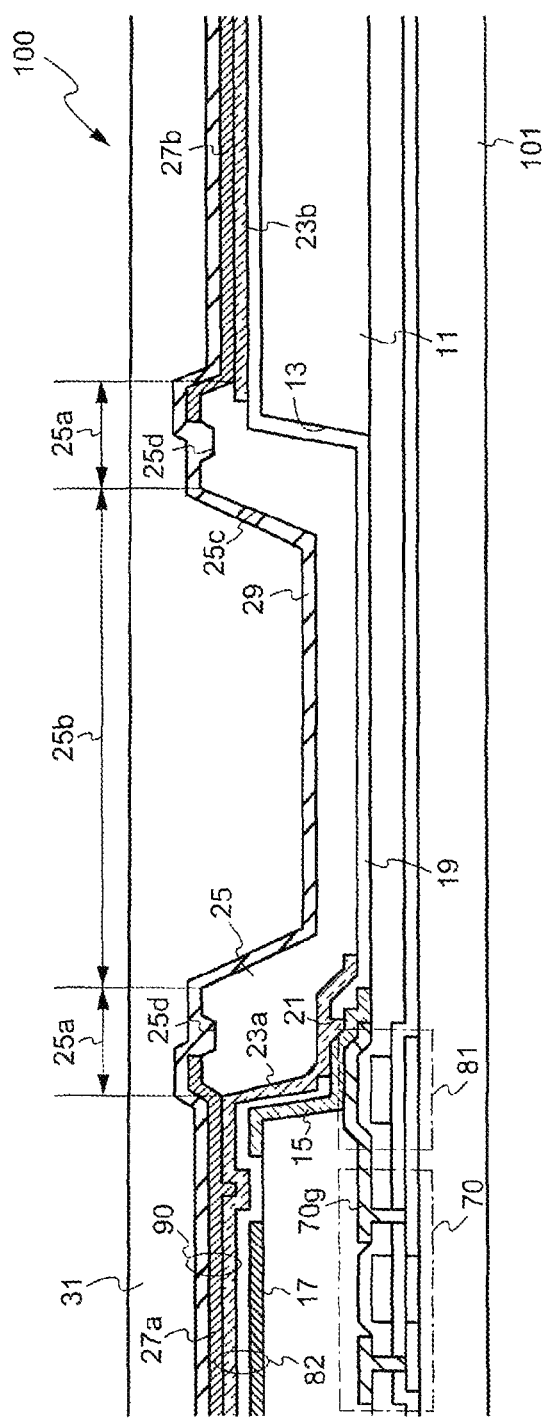
FIG. 2 is a cross-sectional view showing an example of structure of the organic EL display device in embodiment 1.

FIG. 2 is a cross-sectional view schematically showing a structure of the organic EL display device 100 in embodiment 1. Specifically, FIG. 2 shows a cross-section of an area including a border and the vicinity thereof between two adjacent pixels 102a in the organic EL (electroluminescence) display device 100.

As shown in FIG. 2, the thin film transistor 70 and a first storage capacitance 81 are provided on the substrate 101. The thin film transistor 70 is a so-called top gate-type thin film transistor. The thin film transistor 70 is not limited to being of this type and may be of any other type. The thin film transistor 70 shown in FIG. 2 acts as a driving transistor that supplies an electric current to the light emitting element 90.

The structures of the thin film transistor 70 and the first storage capacitance 81 are known, and thus will not be described in detail.

The thin film transistor 70 is covered with an insulating film 11. The insulating film 11 acts as a flattening film that flattens the unevenness caused by the shapes of the thin film transistor 70 and the first storage capacitance 81. In this embodiment, the insulating film 11 is formed of a resin material. The resin material is acrylic resin or polyimide resin, but is not limited to any of these.

In the organic EL display device 100 in this embodiment, the insulating film 11 has an opening 13 formed therein. The opening 13 is formed by removing a part of the insulating film 11. At this point, the opening 11 is formed to expose a part of a drain electrode 70g of the thin film transistor 70.

A transparent electrode 15 is provided from a bottom surface of the opening 13 to a top surface of the insulating film 11. In this embodiment, the transparent electrode 15 is formed by patterning a transparent conductive film formed of a metal oxide such as ITO (Indium Tin Oxide) or the like. The transparent electrode 15 is not limited to this. The transparent electrode 15 is connected with the drain electrode 70g exposed by the opening 13.

A lower electrode 17 of a second storage capacitance 82 is provided on the top surface of the insulating film 11. The lower electrode 17 is provided below the light emitting element 90. The light emitting element 90 in this embodiment is of a structure that outputs light upward. Therefore, a space below the light emitting element 90 is utilized to form the second storage capacitance 82.

The transparent electrode 15 also acts as a protective film that protects the drain electrode 70g of the thin film transistor 70 against etching gas used to form the lower electrode 17.

An insulating film 19 is provided on the transparent electrode 15 and the lower electrode 17. In this embodiment, the insulating film 19 is a silicon nitride film. The insulating film 19 is not limited to this and may be any other inorganic insulating film such as a silicon oxide film or the like. The insulating film 19 has an opening 21 formed therein that exposes a part of the transparent electrode 15.

Pixel electrodes 23a and 23b located away from each other are provided on the insulating film 19. The pixel electrode 23b shown in FIG. 2 is adjacent to a pixel including the pixel electrode 23a. The pixel including the pixel electrode 23b and the pixel including the pixel electrode 23a emit light of the same color. In this example, the pixel electrode 23a will be main described for simpler explanation, but the pixel electrode 23b has substantially the same structure.

The pixel electrode 23a is connected with the transparent electrode 15 via the opening 21 formed in the insulating film 19. Namely, the pixel electrode 23a is connected with the thin film transistor 70 and the first storage capacitance 81 via the transparent electrode 15. The pixel electrode 23a acts as an upper electrode of the second storage capacitance 82, and also acts as an anode electrode of the light emitting element 90. As can be seen from this, the pixel electrode 23a includes a portion located above the insulating film 11 and the a portion located inside the opening 13.

In this embodiment, the pixel electrode 23a has a stack structure including transparent conductive films of ITO or the like and a silver film sandwiched between the transparent conductive films. The pixel electrode 23a is not limited to having such a structure. In order to provide a structure in which light emitted from the light emitting element 90 is output upward, it is preferable that the pixel electrode 23a includes a reflective conductive film.

In this embodiment, the second storage capacitance 82 includes the lower electrode 17, the insulating film 19 and the pixel electrode 23a acting as the upper electrode. Since the insulating film 19 is a silicon nitride film having a relatively high dielectric constant, the second storage capacitance 82 in this embodiment has an advantage of easily having a high capacitance with certainty. In addition, the second storage capacitance 82 is formed by use of the space below the light emitting element 90, and therefore is easily allowed to be large with certainty.

The pixel electrodes 23a and 23b are each partially covered with an insulating film 25. Specifically, the insulating film 25 covers an end of each of the pixel electrodes 23a and 23b separated from each other, and exposes a part of a top surface of each of the pixel electrodes 23a and 23b. In this embodiment, since the opening 13 is provided in advance in the insulating film 11 acting as a flattening film, the insulating film 25 is provided to cover the inside of the opening 13. In other words, as seen in a plan view, the insulating film 11 has the opening 13 in a region corresponding to a region including first regions 25a and a second region 25b described below. The insulating film 25 may be formed of, for example, a resin material such as photosensitive acrylic resin, polyimide resin or the like, but is not limited to being formed of such a material.

In this embodiment, the insulating film 25 acts as a bank defining a light emitting region of the light emitting element 90, and also acts as a mask bearing member that supports a blocking mask used to vapor-deposit the organic EL material. The structure of the insulating film 25 will be described below in detail.

On regions of the top surfaces of the pixel electrodes 23a and 23b that do not overlap the insulating film 25, organic EL layers 27a and 27b are respectively provided. In this embodiment, the organic EL layers 27a and 27b are formed by depositing an organic EL material by vapor deposition. The organic EL layers 27a and 27b each contain at least a light emitting layer and may also include an electron injection layer, an electron transfer layer, a hole injection layer or a hole transfer layer.

In this embodiment, the light emitting layers that emit light of different colors may be provided in different pixels. The light emitting layers may each contain, for example, an organic EL material that emits red, green or blue light. In this embodiment, the light emitting layers included in the organic EL layers 27a and 27b contain an organic EL material that emits green light. It is not indispensable that all the above-listed layers of the organic EL layers 27a and 27b are included in each of all the pixels. A functional layer such as the electron injection layer, the electron transfer layer, the hole injection layer or the hole transfer layer may be provided commonly for a plurality of pixels.

A common electrode 29 formed of a conductive film containing an alkaline metal material is provided on the organic EL layer 27 (the organic EL layers 27a and 27b may be collectively referred to as the "organic EL layer 27"). The alkaline metal material usable for the common electrode 29 may be, for example, magnesium (Mg), lithium (Li) or the like. In this embodiment, an MgAg film formed of an alloy of magnesium and silver is used as the conductive film containing an alkaline metal material. The common electrode 29 acts as a cathode electrode of the light emitting element 90. The common electrode 29 is provided commonly for a plurality of pixels.

In the case where the display device 100 is of a top emission-type, in which the light from the organic EL layer 27 is output upward, namely, is output from the common electrode 29, the common electrode 29 needs to be light-transmissive. Therefore, in the case of being formed of the above-described material, the common electrode 29 is made sufficiently thin to transmit light and thus is made light-transmissive. Specifically, the common electrode 29 may have a thickness of about 10 nm to about 30 nm to be light-transmissive.

A sealing film 31 is provided on the common electrode 29. The sealing film 31 has a role of preventing entrance of moisture from outside and thus preventing deterioration of the organic EL layer 27 and the common electrode 29. Although not shown in detail in FIG. 2, in this embodiment, the sealing film 31 has a three-layer stack structure including silicon nitride films and a resin film sandwiched by the silicon nitride films. The sealing film 31 is not limited to having such a structure. In the case where the sealing film 31 has the three-layer stack structure, the resin film included in the sealing film 31 also plays a role of flattening the unevenness caused by the opening 13 formed in the insulating film 11.

Figure 3:
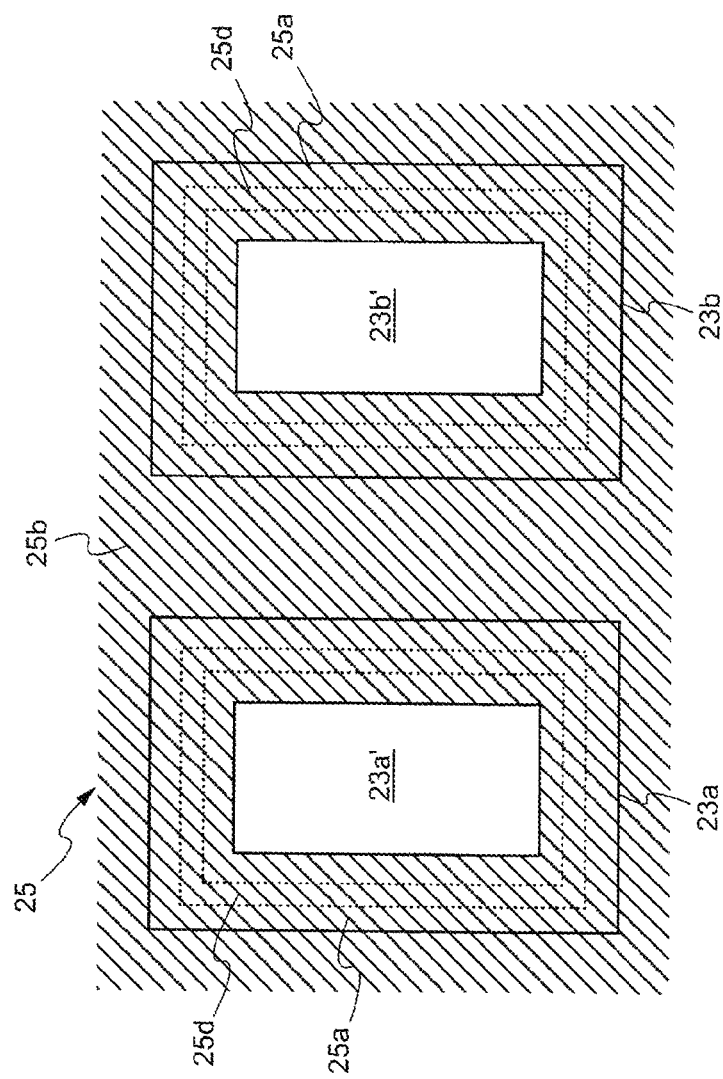
FIG. 3 is a plan view showing an example of structure of a display portion of the organic EL display device in embodiment 1.

Now, with reference to FIG. 2 and FIG. 3, the structure of the insulating film 25 will be described. FIG. 3 is an enlarged plan view of a part of the display portion 102 in the organic EL display device 100 in embodiment 1. Specifically, FIG. 3 is an enlarged view mainly showing the pixel electrodes 23a and 23b adjacent to each other.

As described above, the insulating film 25 is provided to cover the ends of the pixel electrodes 23a and 23b and expose a part of each of the pixel electrodes 23a and 23b. Referring to FIG. 3, the portions of the pixel electrodes 23a and 23b that do not overlap the insulating film 25 (i.e., the exposed portions) are labelled as exposed surfaces 23a' and 23b'. The exposed surfaces 23a' and 23b' each correspond to the light emitting region of the light emitting element 90.

In this state, as shown in FIG. 2 and FIG. 3, as seen in a plan view, the insulating film 25 includes the first regions 25a provided around the exposed surfaces 23a' and 23b', and a second region 25b provided between two adjacent first regions 25a. The second region 25b includes a recessed portion 25c. In this embodiment, as shown in FIG. 3, as seen in a plan view, the first regions 25a are continuously provided all around the exposed surfaces 23a' and 23b'. The first regions 25a are not limited to having such a structure, and may be provided discretely (i.e., in the form of islands) around the exposed surfaces 23a' and 23b'.

As shown in FIG. 2, in this embodiment, in the first regions 25a, a top surface of the insulating film 25 is at a higher level than that of the top surfaces of the pixel electrodes 23a and 23b. In the first regions 25a, grooves 25d are provided in the top surface of the insulating film 25, along the exposed surfaces 23a' and 23b'. In FIG. 3, the grooves 25d are provided all around the exposed surfaces 23a' and 23b'. The grooves 25d are not limited to having such a structure, and may be provided in islands around the exposed surfaces 23a' and 23b'. The grooves 25d may be provided when necessary, and may be omitted.

The organic EL display device 100 in this embodiment includes the insulating film 25 having a structure described above with reference to FIG. 2 and FIG. 3. The insulating film 25 acts as a bank defining the light emitting region of the light emitting element 90, and also acts as a mask bearing member that supports the blocking mask used to vapor-deposit the organic EL material.

<Method for Producing the Organic EL Display Device>

Now, with reference to FIG. 4 to FIG. 9, a method for producing the organic EL display device 100 in this embodiment will be described. FIG. 4 to FIG. 9 are each a cross-sectional view showing a step of the method for producing the organic EL display device 100 in this embodiment.

Figure 4:
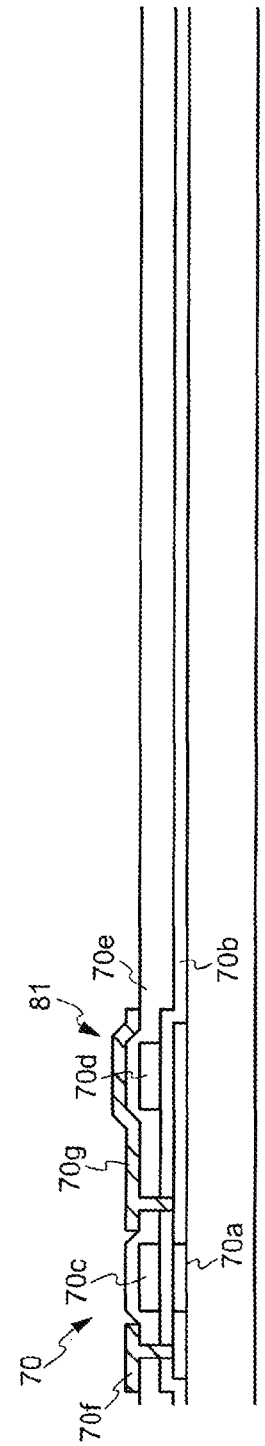
FIG. 4 is a cross-sectional view showing an example of a step of a method for producing the organic EL display device in embodiment 1.

First, as shown in FIG. 4, the thin film transistor 70 and the first storage capacitance 81 are formed on the substrate 101. There is no specific limitation on the method for forming the thin film transistor 70. The thin film transistor 70 may be formed by a known method. The substrate 101 is a glass substrate in this embodiment, but may be any other insulating substrate.

In the case where the substrate 101 is a flexible substrate formed of a resin material, a resin film of polyimide or the like is formed on another support substrate, and the thin film transistor 70 and the first storage capacitance 81 are formed on the resin film. After the sealing film 31 shown in FIG. 2 is formed, the support substrate may be peeled off.

In this embodiment, an underlying insulating film (not shown) is formed on the substrate 101, and a semiconductor film 70a is formed on the underlying insulating film. Next, a gate insulating film 70b is formed to cover the semiconductor film 70a. After the gate insulating film 70b is formed, a gate electrode 70c is formed on a region of the gate insulating film 70b that overlaps the semiconductor film 70a. At the same time as the formation of the gate electrode 70c, a capacitance electrode 70d acting as an upper electrode of the first storage capacitance 81 is formed. The capacitance electrode 70d overlaps the semiconductor film 70a with the gate insulating film 70b being located between the semiconductor film 70a and the capacitance electrode 70d, so as to form the first storage capacitance 81.

Then, an interlayer insulating film 70e is formed to cover the gate electrode 70c and the capacitance electrode 70d. After this, a source electrode 70f and the drain electrode 70g connected to the semiconductor film 70a via a contact hole formed in the interlayer insulating film 70e are formed. In this manner, the thin film transistor 70 and the first storage capacitance 81 are formed on the substrate 101.

Figure 5:
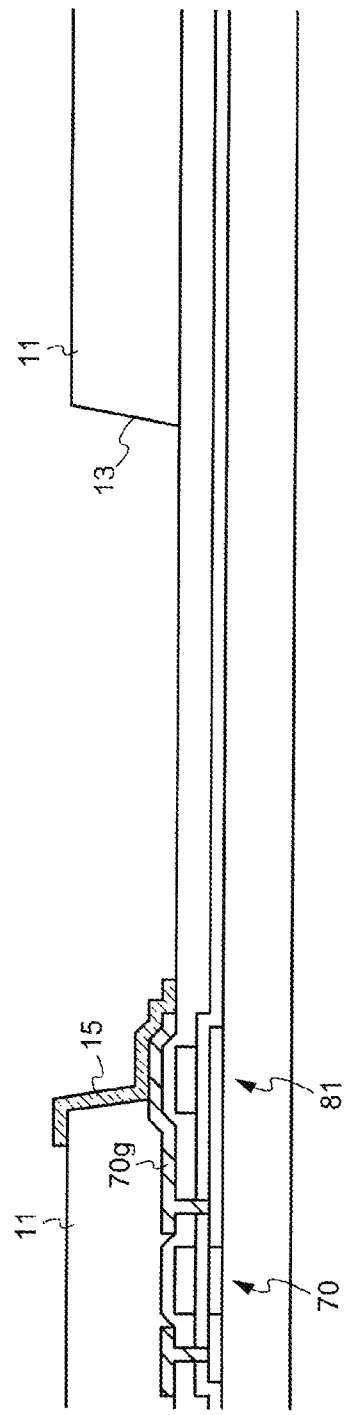
FIG. 5 is a cross-sectional view showing an example of a step of the method for producing the organic EL display device in embodiment 1.

After the thin film transistor 70 and the first storage capacitance 81 are formed, as shown in FIG. 5, the insulating film 11 is formed. In this embodiment, a positive photosensitive acrylic resin material is used as a material for forming the insulating film 11. In more detail, an acrylic resin material for forming the insulating film 11 is applied to form a film, and the film of the acrylic resin material is patterned by photolithography by selectively exposing, to light, a region thereof where the opening 13 is to be formed, and thus the unnecessary part of the acrylic resin material is removed. As a result, the insulating film 11 having the opening 13 formed therein is formed without etching. As shown in FIG. 5, the opening 13 is formed to expose the drain electrode 70g of the thin film transistor 70.

After the opening 13 is formed, the transparent electrode 15 of a metal oxide material such as ITO or the like is formed from the bottom surface of the opening 13 to the top surface of the insulating film 11. The transparent electrode 15 is formed by patterning a transparent conductive film of ITO or the like, formed to cover the insulating film 11, by photolithography. In this step, the transparent electrode 15 is formed to cover the exposed portion of the drain electrode 70g of the thin film transistor 70.

Figure 6:
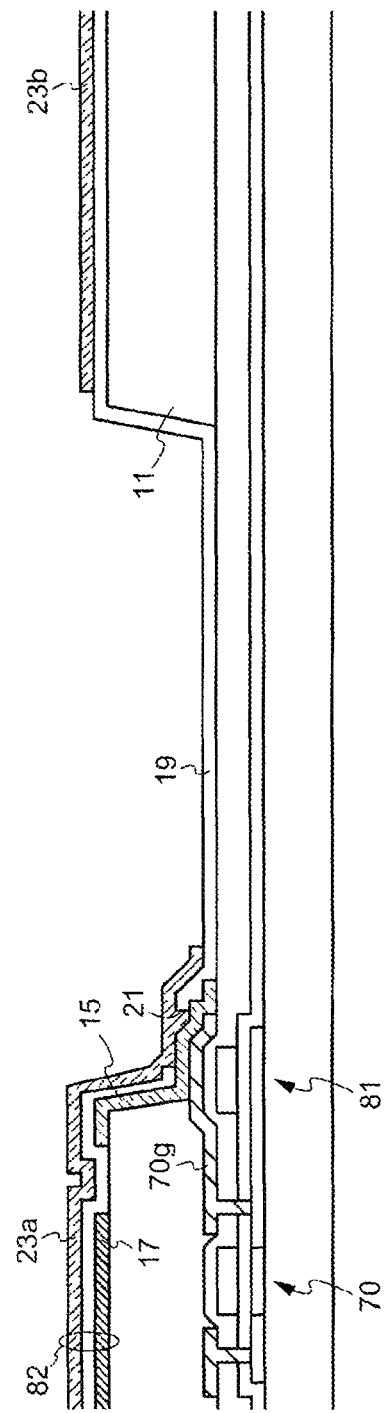
FIG. 6 is a cross-sectional view showing an example of a step of the method for producing the organic EL display device in embodiment 1.

After the transparent electrode 15 is formed, as shown in FIG. 6, the lower electrode 17 of the second storage capacitance 82 is formed. It is preferable that the conductive material used to form the lower electrode 17 has a high etching rate ratio with respect to the metal oxide material used to form the transparent electrode 15. The transparent electrode 15 covers the drain electrode 70g of the thin film transistor 70 to play a role of protecting the drain electrode 70g against etching gas (or etchant) used to form the lower electrode 17.

Next, the insulating film 19 is formed of silicon nitride, and the opening 21 exposing a part of the transparent electrode 15 is formed by photolithography. The insulating film 19 acts as a dielectric body included in the second storage capacitance 82.

After the opening 21 is formed in the insulating film 19, the pixel electrodes 23a and 23b are formed. In this step, the pixel electrode 23a is connected with the transparent electrode 15 via the opening 21. In other words, the pixel electrode 23a is connected with the thin film transistor 70 and the first storage capacitance 81 via the transparent electrode 15. Although not shown, the pixel electrode 23b has substantially the same structure.

Figure 7:
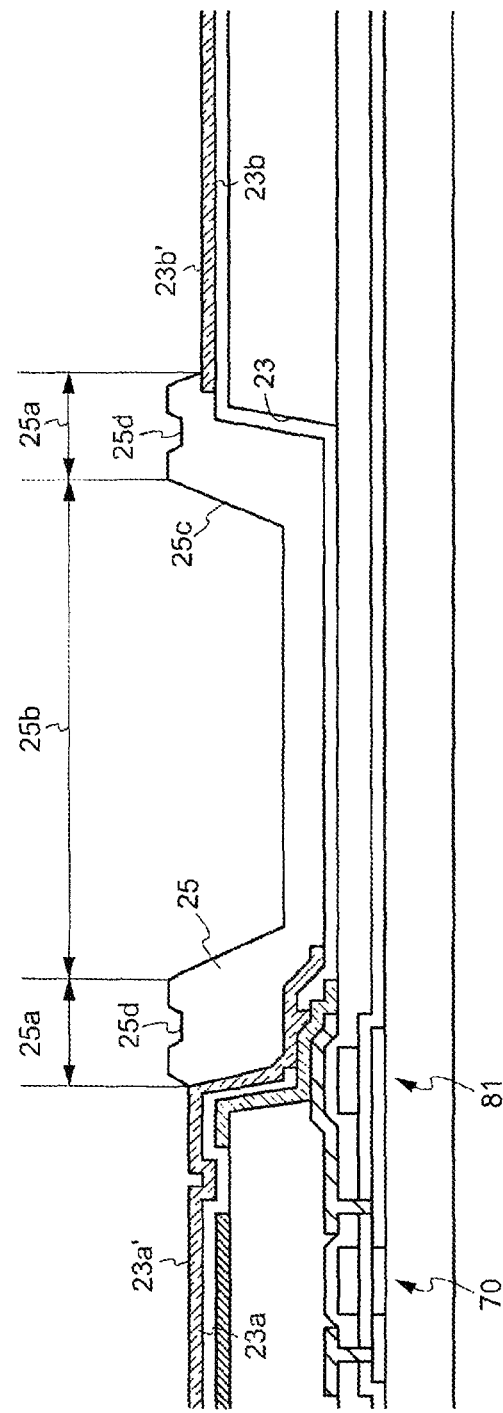
FIG. 7 is a cross-sectional view showing an example of a step of the method for producing the organic EL display device in embodiment 1.

After the pixel electrodes 23a and 23b are formed, as shown in FIG. 7, the insulating film 25 is formed. In this embodiment, a photosensitive acrylic resin material is used as a material for forming the insulating film 25. Specifically, first, a photosensitive acrylic resin material is applied by spin-coating or the like. In this step, the photosensitive acrylic resin material is applied to completely fill the opening 13. The thickness of the film of the photosensitive acrylic resin material is controlled such that the top surface of the film of the photosensitive acrylic resin is at a higher level than that of the top surfaces of the pixel electrodes 23a and 23b. In other words, the thickness of the film of the photosensitive acrylic resin material is controlled such that the film of the photosensitive acrylic resin material has a certain thickness on the top surfaces of the pixel electrodes 23a and 23b.

After being applied, the film of the photosensitive acrylic resin material is selectively exposed to light by ultraviolet light radiation. In this embodiment, since a positive photosensitive acrylic resin material is used, the exposed region is removed by a developing solution. In this embodiment, a half-tone mask is used at the time of ultraviolet light radiation. This allows the degree of exposure to the ultraviolet light to be different region by region. Therefore, a plurality of regions having different thicknesses are formed. Such a use of a half-tone mask allows the insulating film 25, having the structure described above with reference to FIG. 2 and FIG. 3, to be formed by one cycle of exposure to light.

The present invention is not limited to this. Alternatively, a blocking mask may be used to expose, to light, the film of the photosensitive acrylic resin material for each of different regions. Still alternatively, a non-photosensitive resin material may be used for the insulating film 25, and the insulating film 25 having the structure described above with reference to FIG. 2 and FIG. 3 may be formed by photolithography.

As described above, in this embodiment, the insulating film 25 having the structure described above with reference to FIG. 2 and FIG. 3 is formed of a resin material. At this point, as shown in FIG. 2 and FIG. 3, as seen in a plan view, the insulating film 25 includes the first regions 25a provided around the exposed surface 23a' of the pixel electrode 23a and the exposed surface 23b' of the pixel electrode 23b, and the second region 25b provided between two adjacent first regions 25a and including the recessed portion 25c.

As described above, the thickness of the film of the photosensitive acrylic resin material is controlled such that the top surface of the film of the photosensitive acrylic resin is at a higher level than that of the top surfaces of the pixel electrodes 23a and 23b. As a result, the insulating film 25 is formed such that the top surface of the insulating film 25 in the first regions 25a is at a higher level than that of the top surfaces of the pixel electrodes 23a and 23b.

A half-tone mask is used to form a region of a small exposure amount. As a result, as shown in FIG. 3, the grooves 25d are formed in the top surface of the insulating film 25, along the exposed surface 23a' and the exposed surface 23b'.

Figure 8:
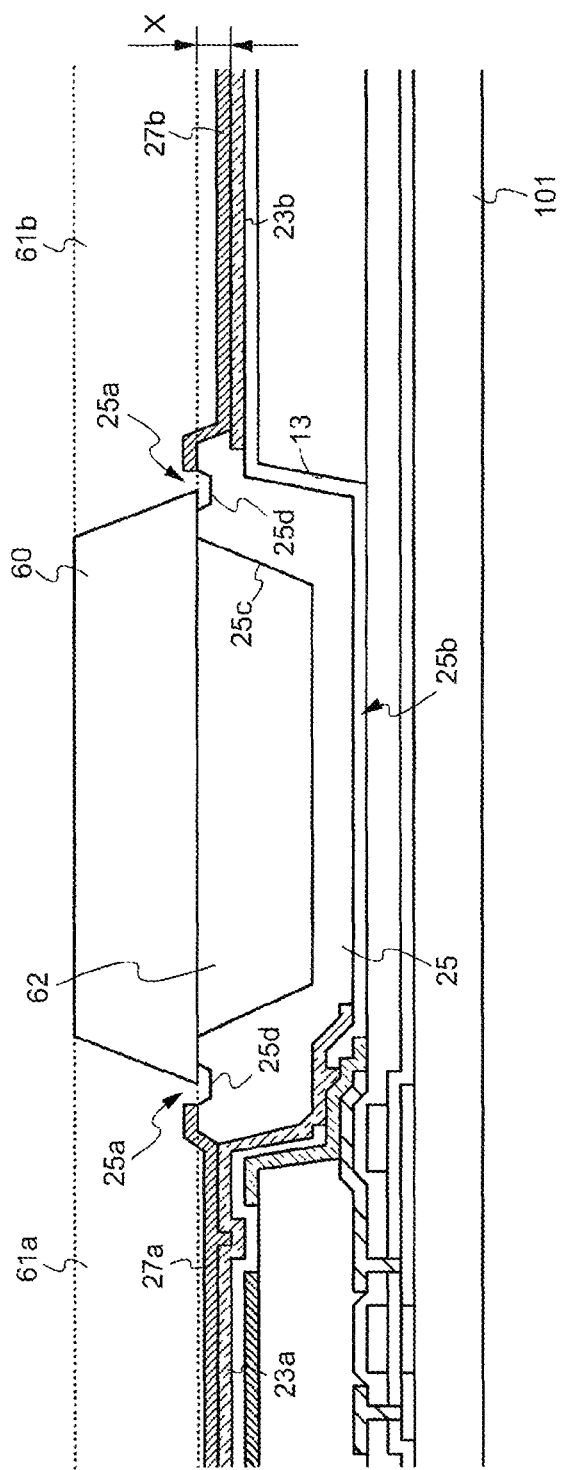
FIG. 8 is a cross-sectional view showing an example of a step of the method for producing the organic EL display device in embodiment 1.

Next, as shown in FIG. 8, the first regions 25a of the insulating film 25 are used as the mask bearing members to locate a blocking mask 60 above the substrate 101. In FIG. 8, it appears that the blocking mask 60 is located only above the opening 13. In actuality, however, the blocking mask 60 is one plate-like member having openings at positions corresponding to a plurality of pixels. For example, as shown in FIG. 8, the blocking mask 60 has an opening 61a above the pixel electrode 23a and also has an opening 61b above the pixel electrode 23b.

In FIG. 8, the dotted lines extending from a top surface and a bottom surface of the blocking mask 60 represent a position of a part of the blocking mask 60 other than the openings 61a and 61b. FIG. 8 shows adjacent pixels emitting light of the same color. Needless to say, pixels emitting light of colors different from the color of the pixels shown in FIG. 8 are covered with the blocking mask 60. In this case, there is a gap corresponding to distance X between the blocking mask 60 and the pixel electrode (not shown) in each of the pixels that emit light of the different colors. Namely, the distance between the top surface of the first region 25a (i.e., the bottom surface of the blocking light 60) and the top surface of the pixel electrode in each of the pixels that emit light of the different colors is equal to distance X. Therefore, although not shown in FIG. 8, the top surface of the pixel electrode included in each of the pixels that emit light of the different colors (in this example, pixels emitting red light and blue light) is covered with the blocking mask 60 with no contact with the blocking mask 60.

In FIG. 8, in the second region 25b of the insulating film 25, a space 62 is formed between the recessed portion 25c and the blocking mask 60. Because of this structure, even if there are foreign objects (e.g., particles, etc.) on the substrate 101, the influence of the foreign objects during the vapor deposition performed by use of the blocking mask 60 is decreased. Specifically, the possibility that the foreign objects held between the blocking mask 60 and the substrate 101 influence the vapor deposition or damage the films on the substrate 101 is decreased.

In this embodiment, as shown in FIG. 3, the grooves 25d are formed in the first regions 25a of the insulating film 25. In this embodiment, as shown in FIG. 8, the blocking mask 60 is located such that edges of the openings 61a and 61b are above the grooves 25d. Without the grooves 25d, when the blocking mask 60 is removed, the material for the vapor deposition attached to the border between the edges of the openings 61a and 61b and the insulating film 25 may undesirably come off and generate particles.

However, in this embodiment, the edges of the openings 61a and 61b are above the grooves 25d. Therefore, the vapor deposition material is prevented from being attached to the border. Thus, the possibility that the particles are generated when the blocking mask 60 is removed is decreased. In this embodiment, the grooves 25d are not indispensable, and may be omitted optionally.

After the blocking mask 60 is located as described above, the vapor source is scanned above the substrate 101 to perform vapor deposition of the organic EL material. As a result, the organic EL layers 27a and 27b are formed inside the openings 61a and 61 b in the blocking mask 60, namely, on the pixel electrodes 23a and 23b. In this embodiment, an organic EL material emitting green light is vapor-deposited to form the organic EL layers 27a and 27b. For vapor-depositing an organic EL material that emits light of a different color, another blocking mask 60 is prepared, or the position of the blocking light 60 is shifted, to perform vapor deposition.

Figure 9:
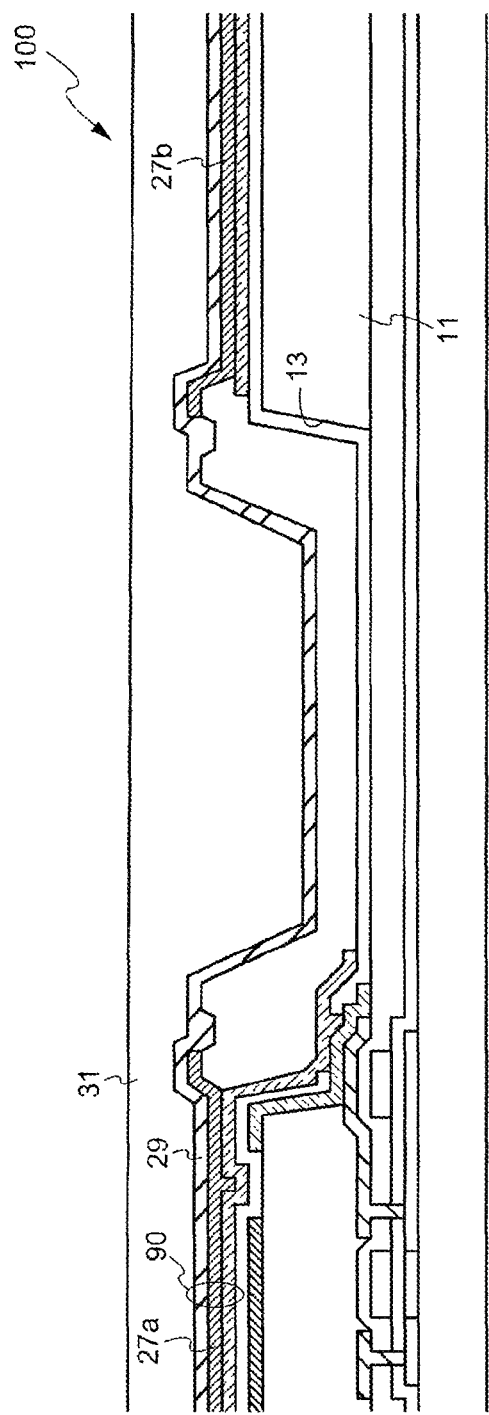
FIG. 9 is a cross-sectional view showing an example of a step of the method for producing the organic EL display device in embodiment 1.

After the organic EL layers 27a and 27b are formed by use of the blocking mask 60, as shown in FIG. 9, the common electrode 29 acting as the cathode electrode of the light emitting element 90 is formed. In this embodiment, an MgAg film is used for the common electrode 90. A conductive film formed of such an alkali-containing material is vulnerable against moisture or the like. Therefore, it is preferable that the vapor deposition to form the organic EL layers 27a and 27b and the vapor deposition to form the common electrode 29 are performed without exposing the materials to the atmosphere. In this case, it is preferable that the vapor deposition to form the organic EL layers 27a and 27b and the vapor deposition to form the common electrode 29 are performed continuously while a vacuum state is maintained. The present invention is not limited to this, and such continuous vapor deposition may be performed while an inactive atmosphere such as a nitrogen atmosphere or the like is maintained.

In a final step, a silicon nitride film, a resin film formed of an acrylic resin material and a silicon nitride film are stacked in this order to form the sealing film 31. In this step, the resin film forming a part of the sealing film 31 flattens the unevenness caused by the opening 13 formed in the insulating film 13. Since the resin film flattens the unevenness, even if foreign objects such as particles or the like are on the common electrode 29, the possibility that the silicon nitride film formed on the resin film is peeled off by the influence of the foreign objects or that a coverage fault is caused is decreased.

As described above, in this embodiment, the insulating film 25 plays a role of a bank defining the light emitting region of the light emitting element 90 and also acts as a mask bearing member that supports the blocking mask 60 used to vapor-deposit the organic EL material. Since the recessed portion 25c is formed in the second region 25b of the insulating film 25, the space 62 is provided with certainty between the blocking mask 60 and the insulating film 25. As a result, the influence of the foreign objects during the vapor deposition of the organic EL material performed by use of the blocking mask 60 is decreased.

Since the first regions 25a of the insulating film 25 act as banks covering the ends of the pixel electrodes 23a and 23b and also act as the mask bearing members that support the blocking mask 60, distance X between the pixel electrodes 23a and 23b and the openings 61a and 62b in the blocking mask 60 is allowed to be shortened. As a result, the shadow region (region where the vapor deposition material is not sufficiently deposited) generated due to the height of the bank and the height of the mask bearing members is suppressed from being generated.

Embodiment 2

In embodiment 2, an insulating film 35 having a different structure as that of the insulating film 25 in embodiment 1 is provided. In this embodiment, structural differences from the organic EL display device 100 in embodiment 1 will be mainly described. Components that are same as those in embodiment 1 will bear the identical reference signs thereto and descriptions thereof may be omitted.

Figure 10:
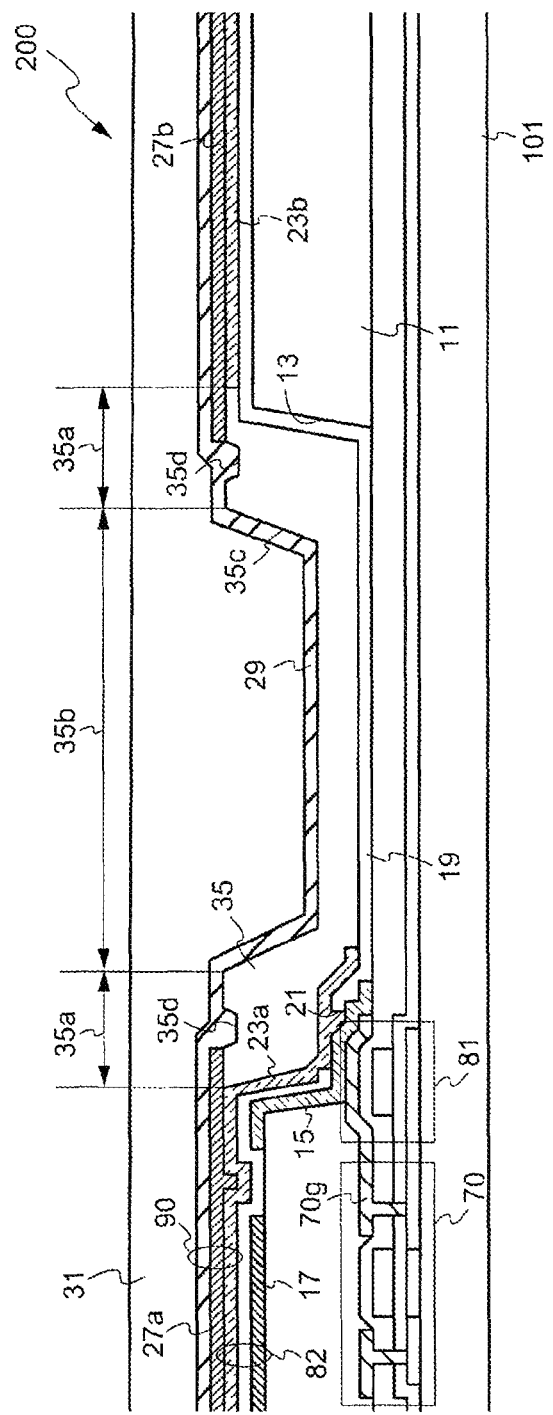
FIG. 10 is a cross-sectional view showing an example of structure of an organic EL display device in embodiment 2.

FIG. 10 is a cross-sectional view schematically showing a structure of an organic EL display device 200 in embodiment 2. As shown in FIG. 10, the insulating film 35 includes first regions 35a, a second region 35b, a recessed portion 35c and grooves 35d. In this structure, a top surface of the insulating film 35 in the first regions 35a is in the same plane as the top surfaces of the pixel electrodes 23a and 23b. In this specification, the state represented by the expression "in the same plane" encompasses a case where the planes of the surfaces are completely match each other and also a case where the planes of the surfaces are considered to generally match each other in light of the technological common knowledge.

In this embodiment, distance X between the pixel electrodes 23a and 23b and the openings 61a and 61b in the blocking mask 60 is still smaller than in embodiment 1.

However, in this embodiment, if the blocking mask 60 is located above the substrate 101 with no arrangement, the blocking mask 60 is in contact with the pixel electrodes in a pixel including a light emitting element that emits light of a color different from that of the pixel electrodes 23a and 23b. Therefore, in this embodiment, it is desirable to provide an improving modification of, for example, providing a recessed portion or a protruding portion at a surface of the blocking mask 60 that faces the substrate 101.

Figure 11B:
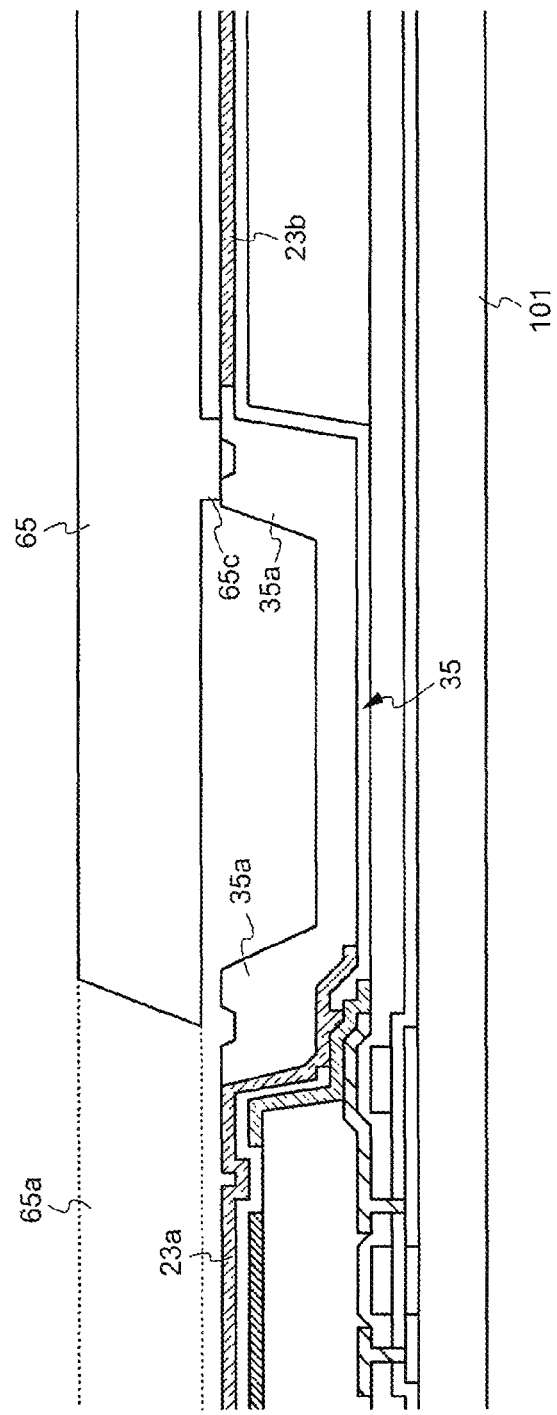
FIG. 11B is a cross-sectional view showing an example of a step of a method for producing the organic EL display device in embodiment 1.

FIG. 11A and FIG. 11B are each a cross-sectional view showing an example of a step of a method for producing the organic EL display device 200 in embodiment 2. A blocking mask 63 shown in FIG. 11A has an opening 63a formed therein, and unlike the blocking mask 60 used in embodiment 1, has a recessed portion 63c at a surface thereof facing the substrate 101. A blocking mask 65 shown in FIG. 11B has an opening 65a formed therein, and unlike the blocking mask 60 used in embodiment 1, includes a support portion 65c on a surface thereof facing the substrate 101. In FIG. 11A and FIG. 11B, vapor deposition is performed on the pixel electrode 23a, but not on the pixel electrode 23b.

As described above, in the organic EL display device 200 in this embodiment, the top surface of the insulating film 35 in the first regions 35a is in the same plane as the top surfaces of the pixel electrodes 23a and 23b. Therefore, the block mask 63 or 65 used in this embodiment is away from the top surface of the pixel electrode 23b by the depth of the recessed portion 63c or the height of the support portion 65c. For example, the blocking mask 63 shown in FIG. 11A has the recessed portion 63c in a region overlapping the pixel electrode 23b as seen in a plan view. The blocking mask 65 shown in FIG. 11B includes the support portion 65c in a region overlapping the first region 35a of the insulating film 35 as seen in a plan view.

Because of such a structure, the blocking mask 63 or 65 and the pixel electrode 23b are prevented from contacting each other. For example, in FIG. 11A, the opening 63a is at a position corresponding to the pixel electrode 23a, and the pixel electrode 23b is covered with the blocking mask 63. In this case, the blocking mask 63 and the pixel electrode 23b do not contact each other. This is also true in the structure shown in FIG. 11B.

In FIG. 11A, the recessed portion 63c is formed above the pixel electrode 23b. The recessed portion 63c may be provided in correspondence with each of the pixels or may be provided commonly for a plurality of pixels. Namely, as long as pixels on which the vapor deposition is not to be performed are located in a concentrated manner, the recessed portion 63c may be provided to cover the entirety of a region including such pixels. In FIG. 11B, the support portion 65c is provided at a position corresponding to the first region 35a of the insulating film 35. The support portion 35c may be provided at any position. The support portion 35c may be provided to surround the pixel electrode 23b or may be provided as being scattered randomly in the display region 102. In either case, it is desirable that the support portion 35c is located at a position overlapping the insulating film 35.

Embodiment 3

In embodiment 3, the structure of the insulating film 25 is different from that in embodiment 1. In this embodiment, structural differences from the organic EL display device 100 in embodiment 1 will be mainly described. Components that are same as those in embodiment 1 will bear the identical reference signs thereto and descriptions thereof may be omitted.

Figure 12:
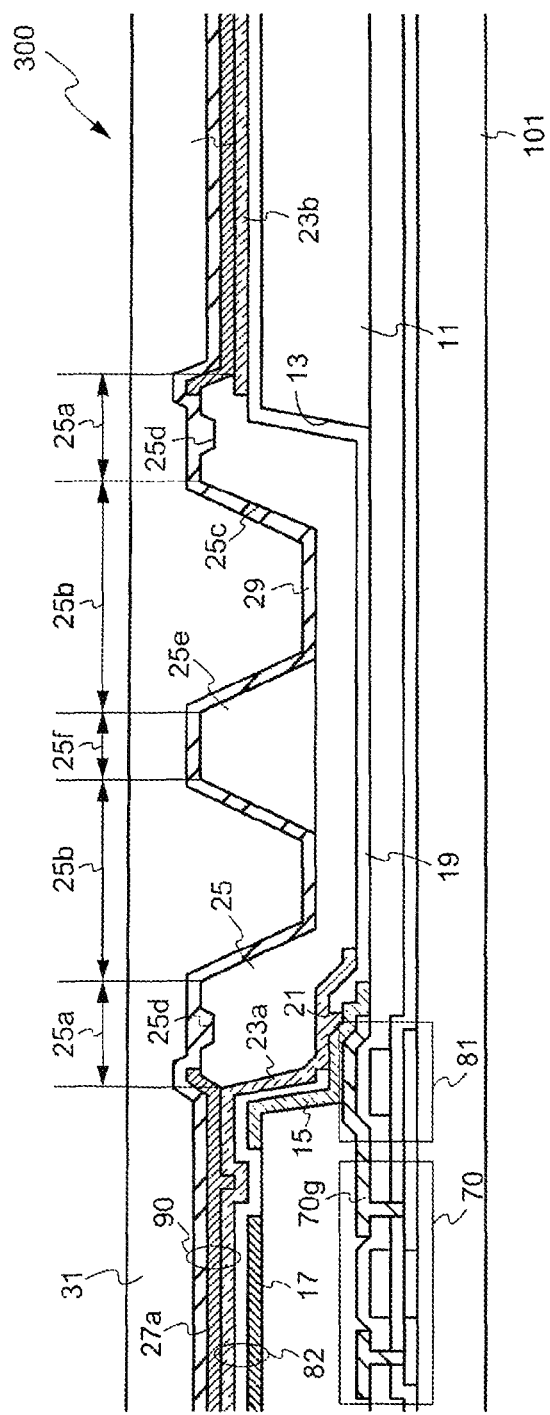
FIG. 12 is a cross-sectional view showing an example of structure of an organic EL display device in embodiment 3.

FIG. 12 is a cross-sectional view schematically showing a structure of an organic EL display device 300 in embodiment 3. As shown in FIG. 12, the insulating film 25 includes the first regions 25a, the second region 25b, the recessed portion 25c, the grooves 25d, and a protruding portion 25e. In this structure, the protruding portion 25e is located in the second region 25b. The protruding portion 25e may be provided linearly along a side surface of the recessed portion 25c or may be provided in the form of dots. In other words, as seen in a plan view, the insulating film 25 may be considered to include a third region 25f surrounded by the second region 25b.

A top surface of the insulating film 25 in the third region 25f (top surface of the protruding portion 25e) may be at a level higher than that of a bottom surface of the recessed portion 25c. However, in the case where the protruding portion 25e acts as a support member of the blocking mask 60 used to perform the vapor deposition, it is preferable that the top surface of the insulating film 25 in the first regions 25a and the top surface of the insulating film 25 in the third region 25f are in the same plane as each other.

In this embodiment, the block mask 60 is supported more stably than in embodiment 1.

Embodiment 4

In embodiment 4, an insulating film 40 having a different structure from that of the insulating film 25 in embodiment 1 is provided. In this embodiment, structural differences from the organic EL display device 100 in embodiment 1 will be mainly described. Components that are same as those in embodiment 1 will bear the identical reference signs thereto and descriptions thereof may be omitted.

Figure 13:
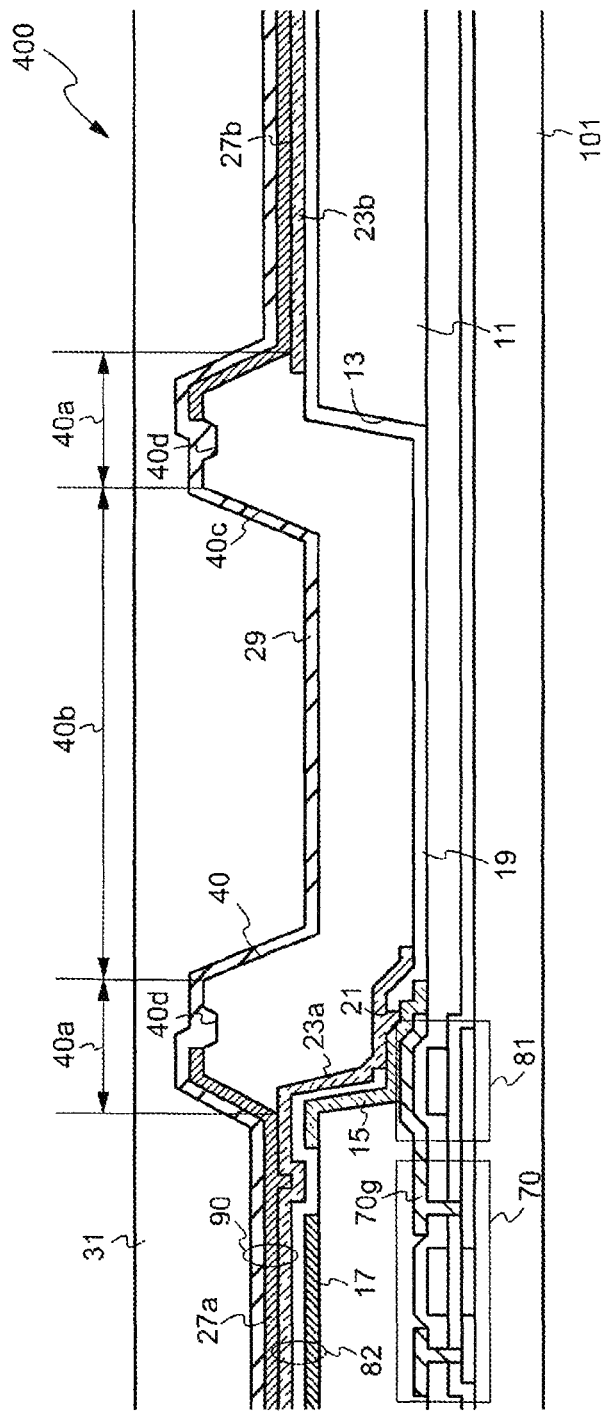
FIG. 13 is a cross-sectional view showing an example of structure of an organic EL display device in embodiment 4.

FIG. 13 is a cross-sectional view schematically showing a structure of an organic EL display device 400 in embodiment 4. As shown in FIG. 13, the insulating film 40 includes first regions 40a, a second region 40b, a recessed portion 40c, and grooves 40d. In this embodiment, a top surface of the insulating film 40 in the first regions 40a is at a higher level than that of the top surface of the insulating film 25 in the first regions 25a in embodiment 1.

In this case, the top surface of the insulating film 40 in the first regions 40a is sufficiently higher than the top surfaces of the pixel electrodes 23a and 23b. Therefore, the possibility that the vapor deposition is influenced by the foreign objects held between the substrate 101 and the blocking mask 60 is decreased more than in embodiment 1.

Embodiment 5

In embodiment 5, the insulating film 40 having a different structure from that of the insulating film 25 in embodiment 1 and embodiment 3 is provided. In this embodiment, structural differences from the organic EL display device 100 in embodiment 1 and the organic EL display device 300 in embodiment 3 will be mainly described. Components that are same as those in embodiment 1 and embodiment 3 will bear the identical reference signs thereto and descriptions thereof may be omitted.

Figure 14:
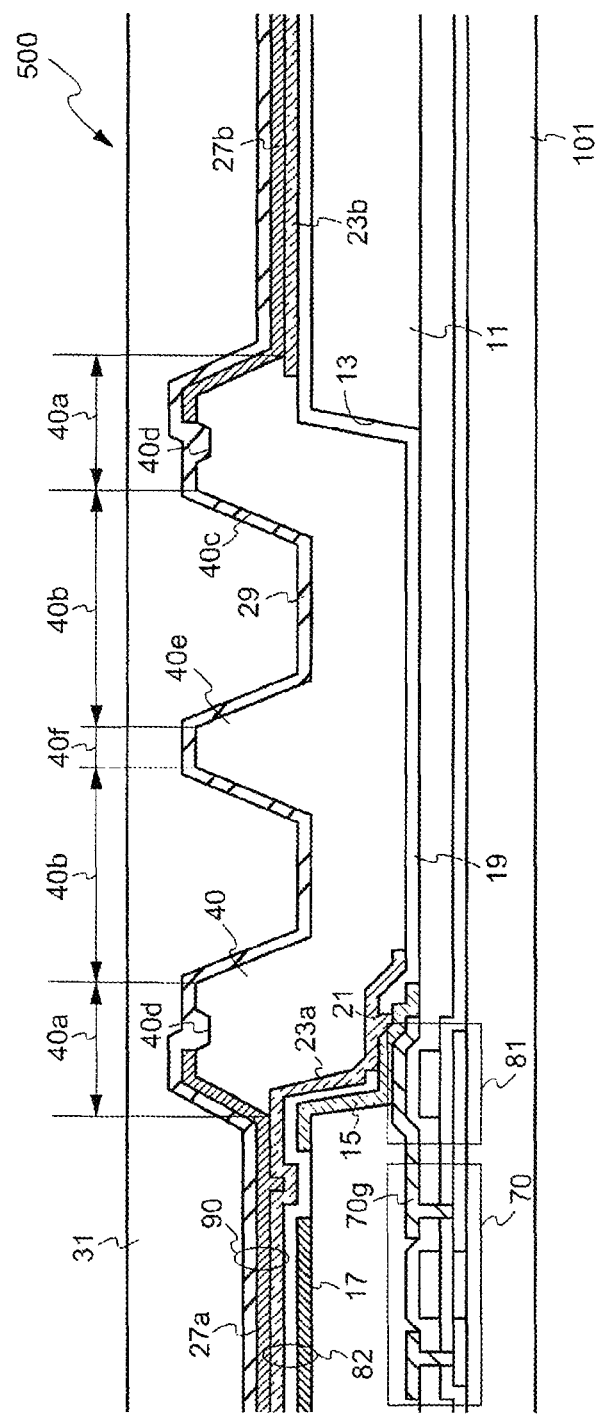
FIG. 14 is a cross-sectional view showing an example of structure of an organic EL display device in embodiment 5.

FIG. 14 is a cross-sectional view schematically showing a structure of an organic EL display device 500 in embodiment 5. As shown in FIG. 14, the insulating film 40 includes the first regions 40a, the second region 40b, the recessed portion 40c, the grooves 40d, and a protruding portion 40e. In this structure, the protruding portion 40e is located in the second region 40b. Like in embodiment 3, the protruding portion 40e may be provided linearly along the side surface of the recessed portion 40c or may be provided in the form of dots. In other words, as seen in a plan view, the insulating film 40 may be considered to include a third region 40f surrounded by the second region 40b.

A top surface of the insulating film 40 in the third region 40f (top surface of the protruding portion 40e) may be at a level higher than that of a bottom surface of the recessed portion 40c. However, in the case where the protruding portion 40e acts as a support member of the blocking mask 60 used to perform the vapor deposition, it is preferable that the top surface of the insulating film 40 in the first regions 40a and the top surface of the insulating film 40 in the third region 40f are in the same plane as each other.

In this embodiment, the block mask 60 is supported more stably than in embodiment 1.

Embodiment 6

In embodiment 6, an insulating film 45 having a different structure from that of the insulating film 25 in embodiment 1 is provided. In this embodiment, structural differences from the organic EL display device 100 in embodiment 1 will be mainly described. Components that are same as those in embodiment 1 will bear the identical reference signs thereto and descriptions thereof may be omitted.

Figure 15:
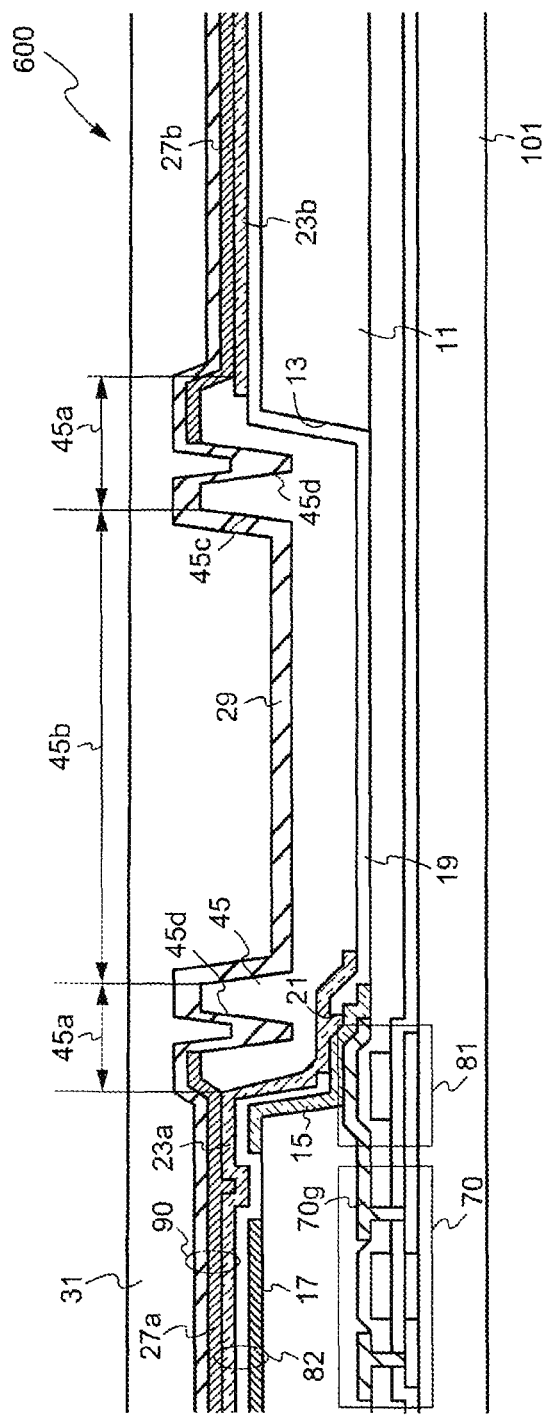
FIG. 15 is a cross-sectional view showing an example of structure of an organic EL display device in embodiment 6.

FIG. 15 is a cross-sectional view schematically showing a structure of an organic EL display device 600 in embodiment 6. As shown in FIG. 15, the insulating film 45 includes first regions 45a, a second region 45b, a recessed portion 45c, and grooves 45d. In this embodiment, the grooves 45e provided in the insulating film 45 in the first regions 45a have a depth different from the depth of the grooves 25d in embodiment 1. Specifically, a bottom surface of the recessed portion 45c and bottom surfaces of the grooves 45d are in the same plane as each other.

In this embodiment, during the ultraviolet light radiation performed on a photosensitive resin material for forming the insulating film 45, the recessed portion 45c and the grooves 45d are formed at the same degree of exposure to light. Namely, the insulating film 45 is formed by use of a general half-tone mask that distinguishes a region to be exposed, a region not to be exposed, and a region to be slightly exposed (region of the insulating film 45 that is to be removed by exposure to a half of the depth), namely, a region where the grooves 45d are to be formed. It is not necessary to use a special half-tone mask having regions of three or more different transmittances. Therefore, embodiment 6 has an advantage of decreasing the production cost over embodiment 1.

Embodiment 7

In embodiment 7, the positional arrangement of the pixels 102a included in the display region 102 are different from that in embodiment 1. In this embodiment, structural differences from the organic EL display device 100 in embodiment 1 will be mainly described. Components that are same as those in embodiment 1 will bear the identical reference signs thereto and descriptions thereof may be omitted.

Figure 16:
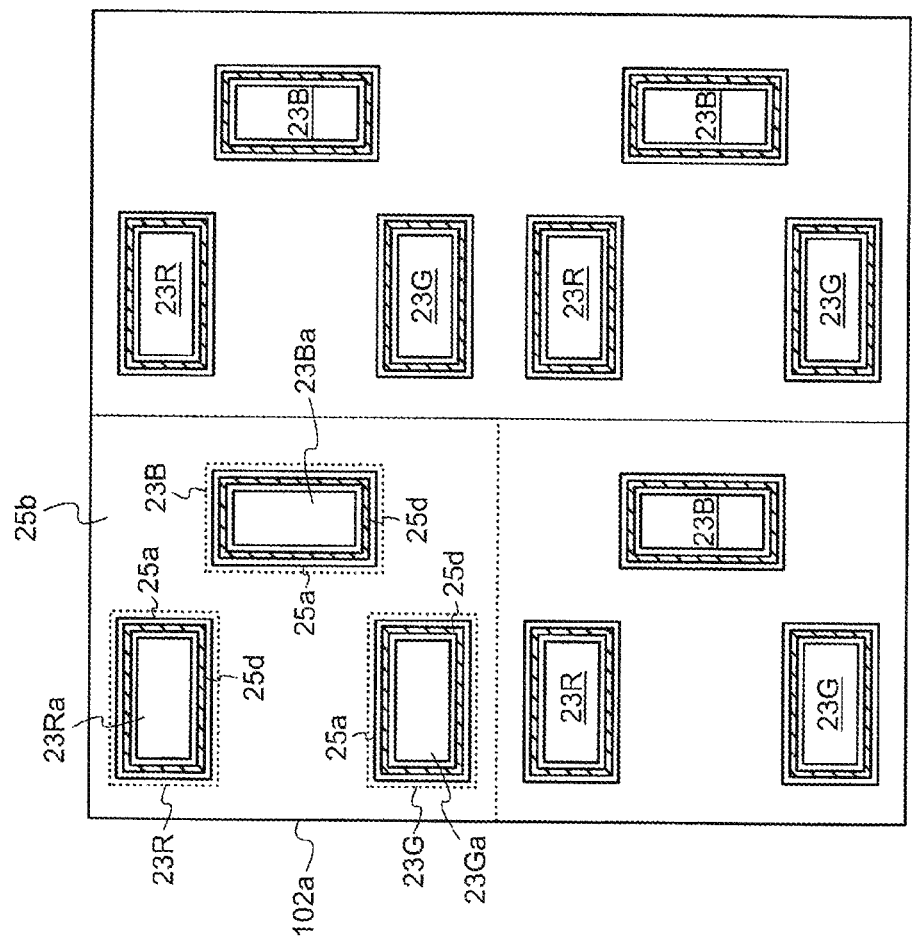
FIG. 16 is a cross-sectional view showing an example of structure of an organic EL display device in embodiment 7.

FIG. 16 is a plan view showing a structure of a display portion of an organic EL display device in embodiment 7. FIG. 16 shows four pixels 102a, but the display region 102 actually include a larger number of pixels 102a.

The pixels 102a each include three sub pixels 23R, 23G and 23B. The sub pixel 23R emits red light, the sub pixel 23G emits green light, and the sub pixel 23B emits blue light. The sub pixels 23R, 23G and 23B respectively have exposed surfaces 23Ra, 23Ga and 23Ba. The exposed surfaces 23Ra, 23Ga and 23Ba are each surrounded by the first region 25a and the groove 25d of the insulating film 25. The region 25b of the insulating film 25 is provided between adjacent sub pixels.

In the structure of the display portion 102 in this embodiment, a sufficient gap is provided between adjacent sub pixels. Therefore, the blocking mask 60 provided in the first regions 25a is supported by a uniformly dispersed force. The possibility that the foreign objects are in the second region 25b is increased, and thus the possibility that the influence of the foreign objects is exerted is still decreased.

The above-described embodiments according to the present invention may be optionally combined as long as no contradiction occurs. The display devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in the condition optionally by a person of ordinary skill in the art. Such devices and methods are encompassed in the scope of the present invention as long as including the gist of the present invention.

Even functions and effects that are different from those provided by the above-described embodiments but are obvious from the description of this specification or are easily expectable by a person of ordinary skill in the art are naturally construed as being provided by the present invention.

What is claimed is:

1. A display device, comprising:
   a substrate having an insulating surface;
   a plurality of pixel electrodes on the insulating surface, the plurality of pixel electrodes located away from each other;
   a first insulating layer covering an end of each of the pixel electrodes and exposing a part of a top surface of each of the pixel electrodes; and
   an organic layer provided on each of the pixel electrodes, the organic layer including a light emitting layer, wherein
   as seen in a plan view, the first insulating layer includes a plurality of first regions, each of the plurality of first regions being around the exposed part of the top surface of the pixel electrodes, and a second region located between two adjacent first regions, the second region including a recessed portion.

2. The display device according to claim 1, wherein
   a distance between the insulating surface and a top surface of the first insulating layer in the first region is greater than a distance between the insulating surface and the top surfaces of the pixel electrodes.

3. The display device according to claim 1, wherein
   as seen in a plan view, each of the plurality of first regions is provided so as to surround the exposed part of the top surface of each of the pixel electrode continuously.

4. The display device according to claim 1, wherein
   in each of the plurality of first regions, the first insulating layer has a groove provided along the exposed part of the top surface of each of the pixel electrodes.

5. The display device according to claim 4, wherein
   a bottom surface of the recessed portion and a bottom surface of the groove are in the same plane as each other.

6. The display device according to claim 1, further comprising a second insulating layer, wherein
   the plurality of pixel electrodes are provided on the second insulating layer, and
   as seen in a plan view, the second insulating layer has an opening in a region corresponding to a region including one of the first regions and the second region.

7. The display device according to claim 6, wherein
   a top surface of the first insulating layer in the first region and the top surfaces of the pixel electrodes are in the same plane as each other.

8. The display device according to claim 1, wherein
   the first insulating layer further includes a third region surrounded by the second region as seen in a plan view, and
   a distance between the insulating surface and a top surface of the first insulating layer in the third region is greater than a distance between the insulating surface and a bottom surface of the recessed portion.

9. The display device according to claim 8, wherein
   a top surface of the first insulating layer in the first region and the top surface of the first insulating layer in the third region are in the same plane as each other.

* * * * *